United States Patent
Mukherjee

(10) Patent No.: US 9,774,856 B1
(45) Date of Patent: Sep. 26, 2017

(54) ADAPTIVE STOCHASTIC ENTROPY CODING

(75) Inventor: Debargha Mukherjee, Sunnyvale, CA (US)

(73) Assignee: GOOGLE INC., Mountain View, CA (US)

(*) Notice: Subject to any disclaimer, the term of this patent is extended or adjusted under 35 U.S.C. 154(b) by 1058 days.

(21) Appl. No.: 13/539,753

(22) Filed: Jul. 2, 2012

(51) Int. Cl.
*H04N 19/13* (2014.01)
*H03M 7/40* (2006.01)

(52) U.S. Cl.
CPC .............. *H04N 19/13* (2014.11); *H03M 7/40* (2013.01)

(58) Field of Classification Search
None
See application file for complete search history.

(56) References Cited

U.S. PATENT DOCUMENTS

| | | |
|---|---|---|
| 4,710,810 A | 12/1987 | Koga |
| 5,016,010 A | 5/1991 | Sugiyama |
| 5,150,209 A | 9/1992 | Baker et al. |
| 5,260,783 A | 11/1993 | Dixit |
| 5,461,423 A | 10/1995 | Tsukagoshi |
| 5,650,782 A | 7/1997 | Kim |
| 5,686,962 A | 11/1997 | Chung et al. |
| 5,708,473 A | 1/1998 | Mead |
| 5,767,909 A | 6/1998 | Jung |
| 5,777,680 A | 7/1998 | Kim |
| 5,818,536 A | 10/1998 | Morris et al. |
| 5,886,652 A | 3/1999 | Adachi et al. |

(Continued)

FOREIGN PATENT DOCUMENTS

| | | |
|---|---|---|
| CN | 1741616 A | 3/2006 |
| CN | 101039430 A | 9/2007 |

(Continued)

OTHER PUBLICATIONS

Marpe, et al., Context-Based Adaptive Binary Arithmetic Coding in the H.264/AVC Video Compression Standard, IEEE Transactions on Circuits and Systems for Video Technology, vol. 13, No. 7, Jul. 2003.*

(Continued)

*Primary Examiner* — William C Vaughn, Jr.
*Assistant Examiner* — Michael J Hess
(74) *Attorney, Agent, or Firm* — Young Basile Hanlon & MacFarlane, P.C.

(57) ABSTRACT

A method and apparatus for performing adaptive stochastic entropy encoding and decoding are provided. Adaptive stochastic entropy encoding may include identifying a current portion of an input video stream, and identifying a current probability distribution, which may be an adapted probability distribution associated with a previously encoded portion of the video stream. Adaptive stochastic entropy encoding may include identifying a forward update probability distribution based on the current portion, generating a modified probability distribution for the current portion based on the forward update probability distribution and the current probability distribution, generating an encoded portion based on the current portion and the modified probability distribution, and generating an adapted probability distribution based on the current probability distribution and the forward update probability distribution.

22 Claims, 6 Drawing Sheets

(56) References Cited

U.S. PATENT DOCUMENTS

| | | | |
|---|---|---|---|
| 6,125,144 A | 9/2000 | Matsumura et al. | |
| 6,157,326 A | 12/2000 | Van Der Vleuten et al. | |
| 6,212,234 B1 | 4/2001 | Andoh et al. | |
| 6,256,423 B1 | 7/2001 | Krishnamurthy et al. | |
| 6,314,208 B1 | 11/2001 | Konstantinides et al. | |
| 6,414,995 B2 | 7/2002 | Okumura et al. | |
| 6,418,166 B1 | 7/2002 | Wu et al. | |
| 6,434,197 B1 | 8/2002 | Wang et al. | |
| 6,473,463 B2 | 10/2002 | Agarwal | |
| 6,501,860 B1 | 12/2002 | Charrier et al. | |
| 6,522,784 B1 | 2/2003 | Zlotnick | |
| 6,570,924 B1 | 5/2003 | Lynch et al. | |
| 6,661,842 B1 | 12/2003 | Abousleman | |
| 6,661,925 B1 | 12/2003 | Pianykh et al. | |
| 6,856,701 B2 | 2/2005 | Karczewicz et al. | |
| 6,907,079 B2 | 6/2005 | Gomila et al. | |
| 6,917,651 B1 | 7/2005 | Yoo et al. | |
| 6,985,527 B2 | 1/2006 | Gunter et al. | |
| 7,010,032 B1 | 3/2006 | Kikuchi et al. | |
| 7,085,425 B2 | 8/2006 | Christopoulos et al. | |
| 7,116,831 B2 | 10/2006 | Mukerjee et al. | |
| 7,226,150 B2 | 6/2007 | Yoshimura et al. | |
| 7,432,329 B2 | 10/2008 | Haubennestel et al. | |
| 7,496,143 B2 | 2/2009 | Schwarz et al. | |
| 7,843,998 B2 | 11/2010 | Bjontegaard | |
| 8,064,527 B2 | 11/2011 | Liu et al. | |
| 8,116,373 B2 | 2/2012 | Base et al. | |
| 8,200,033 B2 | 6/2012 | Mietens et al. | |
| 8,254,700 B1 | 8/2012 | Rastogi | |
| 8,265,162 B2 | 9/2012 | Tian et al. | |
| 8,270,738 B2 | 9/2012 | Raveendran et al. | |
| 8,311,119 B2 | 11/2012 | Srinivasan | |
| 8,331,444 B2 | 12/2012 | Karczewicz et al. | |
| 8,344,917 B2 | 1/2013 | Misra et al. | |
| 8,374,445 B2 | 2/2013 | Benndorf | |
| 8,401,083 B2 | 3/2013 | Crotty et al. | |
| 8,938,001 B1 | 1/2015 | Bankoski et al. | |
| 2001/0022815 A1 | 9/2001 | Agarwal | |
| 2002/0009153 A1 | 1/2002 | Jeon et al. | |
| 2002/0036705 A1 | 3/2002 | Lee et al. | |
| 2002/0071485 A1 | 6/2002 | Caglar et al. | |
| 2002/0080871 A1 | 6/2002 | Fallon et al. | |
| 2003/0081850 A1 | 5/2003 | Karczewicz et al. | |
| 2003/0128886 A1 | 7/2003 | Said | |
| 2003/0215018 A1 | 11/2003 | MacInnis et al. | |
| 2003/0227972 A1 | 12/2003 | Fukuda | |
| 2004/0013308 A1 | 1/2004 | Jeon et al. | |
| 2004/0120398 A1 | 6/2004 | Zhang et al. | |
| 2004/0131117 A1 | 7/2004 | Sheraizin et al. | |
| 2004/0151252 A1 | 8/2004 | Sekiguchi et al. | |
| 2004/0234144 A1 | 11/2004 | Sugimoto et al. | |
| 2005/0123207 A1 | 6/2005 | Marpe et al. | |
| 2005/0152459 A1 | 7/2005 | Lobo et al. | |
| 2005/0180500 A1 | 8/2005 | Chiang et al. | |
| 2005/0201470 A1 | 9/2005 | Sievers | |
| 2005/0276323 A1 | 12/2005 | Martemyanov et al. | |
| 2005/0276333 A1 | 12/2005 | Park | |
| 2006/0001557 A1 | 1/2006 | Liao | |
| 2006/0098738 A1 | 5/2006 | Cosman et al. | |
| 2006/0126724 A1 | 6/2006 | Cote et al. | |
| 2006/0203916 A1 | 9/2006 | Chandramouly et al. | |
| 2007/0025441 A1 | 2/2007 | Ugur et al. | |
| 2007/0127831 A1 | 6/2007 | Venkataraman | |
| 2007/0136742 A1 | 6/2007 | Sparrell | |
| 2007/0177673 A1 | 8/2007 | Yang | |
| 2008/0013633 A1 | 1/2008 | Ye et al. | |
| 2008/0170615 A1 | 7/2008 | Sekiguchi et al. | |
| 2008/0181299 A1 | 7/2008 | Tian et al. | |
| 2008/0310503 A1 | 12/2008 | Lee et al. | |
| 2008/0310745 A1 | 12/2008 | Ye et al. | |
| 2009/0175332 A1 | 7/2009 | Karczewicz et al. | |
| 2009/0190659 A1 | 7/2009 | Lee et al. | |
| 2010/0054328 A1 | 3/2010 | Nozawa | |
| 2010/0097250 A1 | 4/2010 | Demircin et al. | |
| 2010/0098169 A1 | 4/2010 | Budagavi | |
| 2010/0290568 A1 | 11/2010 | Suzuki et al. | |
| 2011/0080946 A1 | 4/2011 | Li et al. | |
| 2011/0243225 A1 | 10/2011 | Min et al. | |
| 2012/0020408 A1 | 1/2012 | Chen et al. | |
| 2012/0082220 A1 | 4/2012 | Mazurenko et al. | |
| 2012/0140822 A1 | 6/2012 | Wang et al. | |
| 2012/0147948 A1* | 6/2012 | Sole et al. | 375/240.02 |
| 2012/0183052 A1 | 7/2012 | Lou et al. | |
| 2012/0207222 A1 | 8/2012 | Lou et al. | |
| 2012/0236931 A1 | 9/2012 | Karczewicz et al. | |
| 2012/0243605 A1 | 9/2012 | Turlikov et al. | |
| 2012/0320978 A1 | 12/2012 | Ameres et al. | |
| 2012/0328026 A1 | 12/2012 | Sole Rojals et al. | |
| 2013/0003829 A1* | 1/2013 | Misra et al. | 375/240.12 |
| 2013/0003835 A1 | 1/2013 | Sole Rojals et al. | |
| 2013/0027230 A1 | 1/2013 | Marpe et al. | |
| 2014/0177708 A1* | 6/2014 | Alshin et al. | 375/240.12 |

FOREIGN PATENT DOCUMENTS

| | | |
|---|---|---|
| EP | 1351510 | 10/2003 |
| EP | 1768415 | 3/2007 |
| EP | 2235950 | 10/2010 |
| EP | 2677750 A1 | 12/2013 |
| JP | 61092073 | 5/1986 |
| JP | 2217088 | 8/1990 |
| JP | 2272970 | 11/1990 |
| JP | 8280032 | 10/1996 |
| JP | 09247682 | 9/1997 |
| JP | 11262018 | 9/1999 |
| JP | 11289544 | 10/1999 |
| JP | 11313332 | 11/1999 |
| JP | 11513205 | 11/1999 |
| JP | 2002141806 | 5/2002 |
| JP | 2003046944 | 2/2003 |
| JP | 2003235044 | 8/2003 |
| JP | 2006033148 A | 2/2006 |
| KR | 100213018 | 8/1999 |
| KR | 20010030916 | 4/2001 |
| WO | WO0150770 | 7/2001 |
| WO | WO03026315 | 3/2003 |
| WO | WO2009091279 A1 | 7/2009 |
| WO | WO2012119463 A1 | 9/2012 |

OTHER PUBLICATIONS

Richardson, "H.264 / MPEG-4 Part 10: Introduction to CABAC," Oct. 17, 2002.*

I. H.Witten, R. M. Neal, and J. G. Cleary, "Arithmetic coding for data compression," Commun. ACM, vol. 30, pp. 520-540, Jun. 1987.*

Yoo et al., "Image Subband Coding Using Context-based Classification and Adaptive Quantization," IEEE Transactions on Image Processing, vol. 8, Issue 12, pp. 1702-1715, 1999.*

Park, Jun Sung, et al., "Selective Intra Prediction Mode Decision for H.264/AVC Encoders", World Academy of Science, Engineering and Technology 13, (2006).

"Series H: Audiovisual and Multimedia Systems; Infrastructure of audiovisual services—Coding of moving video; Advanced video coding for generic audiovisual services". H.264. Version 1. International Telecommunication Union. Dated May 2003.

"Series H: Audiovisual and Multimedia Systems; Infrastructure of audiovisual services—Coding of moving video; Advanced video coding for generic audiovisual services". H.264. Version 3. International Telecommunication Union. Dated Mar. 2005.

"Overview; VP7 Data Format and Decoder". Version 1.5. On2 Technologies, Inc. Dated Mar. 28, 2005.

"Series H: Audiovisual and Multimedia Systems; Infrastructure of audiovisual services—Coding of moving video; Advanced video coding for generic audiovisual services". H.264. Amendment 1: Support of additional colour spaces and removal of the High 4:4:4 Profile. International Telecommunication Union. Dated Jun. 2006.

"VP6 Bitstream & Decoder Specification". Version 1.02. On2 Technologies, Inc. Dated Aug. 17, 2006.

"Series H: Audiovisual and Multimedia Systems; Infrastructure of audiovisual services—Coding of moving video". H.264. Amend-

(56) References Cited

OTHER PUBLICATIONS ment 2: New profiles for professional applications. International Telecommunication Union. Dated Apr. 2007.
"VP6 Bitstream & Decoder Specification". Version 1.03. On2 Technologies, Inc. Dated Oct. 29, 2007.
"Series H: Audiovisual and Multimedia Systems; Infrastructure of audiovisual services—Coding of moving video". H.264. Advanced video coding for generic audiovisual services. Version 8. International Telecommunication Union. Dated Nov. 1, 2007.
"Series H: Audiovisual and Multimedia Systems; Infrastructure of audiovisual services—Coding of moving video". H.264. Advanced video coding for generic audiovisual services. International Telecommunication Union. Version 11. Dated Mar. 2009.
"Series H: Audiovisual and Multimedia Systems; Infrastructure of audiovisual services—Coding of moving video". H.264. Advanced video coding for generic audiovisual services. International Telecommunication Union. Version 12. Dated Mar. 2010.
"Implementors' Guide; Series H: Audiovisual and Multimedia Systems; Coding of moving video: Implementors Guide for H.264: Advanced video coding for generic audiovisual services". H.264. International Telecommunication Union. Version 12. Dated Jul. 30, 2010.
"VP8 Data Format and Decoding Guide". WebM Project. Google On2. Dated: Dec. 1, 2010.
Bankoski et al. "VP8 Data Format and Decoding Guide; draft-bankoski-vp8-bitstream-02" Network Working Group. Dated May 18, 2011.
Bankoski et al. "Technical Overview of VP8, an Open Source Video Codec for the Web". Dated Jul. 11, 2011.
Bankoski, J., Koleszar, J., Quillio, L., Salonen, J., Wilkins, P., and Y. Xu, "VP8 Data Format and Decoding Guide", RFC 6386, Nov. 2011.
Mozilla, "Introduction to Video Coding Part 1: Transform Coding", Video Compression Overview, Mar. 2012, 171 pp.
Auyeung C. et al.:"Parallel processing friendly simplified context selection of significance map", 4.JCT-VC Meeting; 95. MPEG Meeting; Jan. 20, 2011-Jan. 28, 2011; Daegu; (Joint Collaborative Team on Video Coding of IS/IEC JTC1/SC29/WG11 and ITU-T SG.16); URL:http://wftp3.itu.int/AV-ARCH/JCTVC-SITE/, No. JCTVC-D260, Jan. 16, 2011, all pages.

Canadian Office Action in CA2810899, related to U.S. Appl. No. 13/253,385, mailed Jan. 25, 2015.
Chenjie Tu et al., "Context-Based Entropy of Block Transform Coefficients for Image Compression" IEEE 11, No. 11, Nov. 1, 2002, pp. 1271-1283.
ISR & Written Opinion in Application # PCT/US2012/024608; mailed Jun. 5, 2012.
ISR and Written Opinion of the International Searching Authority, for Int'l Application No. PCT/US2012/020707; Feb. 15, 2012, 15 pages.
J-R Ohm, et al., "Report of the 4th JCT-VC Meeting", JCT-VC Meeting, Jan. 24, 2011.
Lou J, et al., "On Context Selection for Significant_Coeff_Flag Coding", 96. MPEG Meeting Mar. 21-Mar. 25, 2011, JCTVC-E362.
Lou, Jian, et al., "Parallel Processing Friendly Context Modeling for Significance Map Coding in CABAC",4.JCT-VC Meeting; 95. MPEG Meeting; Jan. 20, 2011-Jan. 28, 2011; Daegu; (Joint Collaborative Team on Video Coding of IS/IEC JTC1/SC29/WG11 and ITU-T SG.16); URL:http://wftp3.itu.int/AV-ARCH/JCTVC-SITE/, No. JCTVC-D241, Jan. 19, 2011, all pages.
Sole, et al., Parallel Context Processing for the significance map in high coding efficiency. Joel Sole, JCTVC_D262, ver 1, 2011-01016.
Sze V, et al.,"CE11: Simplified context selection for significan t_coeff_flag (JCTVC-C227)", JCT_VC Meeting, Jan. 15, 2011.
Vadim Seregin, et al., "Low-Complexity Adaptive Coefficients Scanning", Joint Collaborative Team on Video Coding (JCT-VC) of ITU-T SG16 WP3 and ISO/IEC JTC1/SC29 WG11, vol. JCTCV-C205, Oct. 2, 2010, all pages.
Winken (Fraunhofer HHI) M. et al., "Description of Video Coding Technology Proposal by Fraunhoffer HHI", 1. JCT-VC Meeting Apr. 15, 2010-Apr. 23, 2010; Dresden; (Joint Collaborative Team on Video Coding of IS/IEC JTC1/SC29/WG11 and ITU-T SG.16); JCTVC-A116, URL:http://wftp3.itu.int/AV-ARCH/JCTVC-SITE/, No. 24 Apr. 2010, all pages.
Wiegand, Thomas, Study of Final Committee Draft of Joint Video Specification (ITU-T Rec. H.264 | ISO/IEC 14496-10 AVC), Joint Video Team (JVT) of ISO/IEC MPEG & ITU-T VCEG (ISO/IEC JTC1/SC29/WG11 and ITU-T SG16 Q.6), JVT-F100, Dec. 5, 2002.
Wiegand, et al., Overview of th H.264/AVC Video Coding Standard, IEEE Transactions on Circuits and Systems for Video Technology, p. 1-19, Jul. 2003.

* cited by examiner

ADAPTIVE STOCHASTIC ENTROPY CODING

TECHNICAL FIELD

This application relates to video encoding and decoding.

BACKGROUND

Digital video can be used, for example, for remote business meetings via video conferencing, high definition video entertainment, video advertisements, or sharing of user-generated videos. Accordingly, it would be advantageous to provide high resolution video transmitted over communications channels having limited bandwidth.

SUMMARY

Disclosed herein are aspects of systems, methods, and apparatuses for encoding and decoding of a video signal using adaptive stochastic entropy coding.

An aspect is a method for decoding a video stream. The method may include identifying a current probability distribution, which may be an adapted probability distribution associated with a previously decoded portion of the video stream. The method may include generating a modified probability distribution for decoding a current portion from the video stream using the current probability distribution, decoding the current portion using the modified probability distribution, identifying a forward update probability distribution for the current portion, and generating an adapted probability distribution based on the current probability distribution and the forward update probability distribution.

Another aspect is a method for encoding a video stream. The method may include identifying a current portion of an input video stream, and identifying a current probability distribution, which may be an adapted probability distribution associated with a previously encoded portion of the video stream. The method may include identifying a forward update probability distribution based on the current portion, generating a modified probability distribution for the current portion based on the forward update probability distribution and the current probability distribution, generating an encoded portion based on the current portion and the modified probability distribution, and generating an adapted probability distribution based on the current probability distribution and the forward update probability distribution.

Another aspect is an apparatus for decoding a video stream. The apparatus may include a memory and at least one processor configured to execute instructions stored in the memory to identify a current probability distribution, which may be an adapted probability distribution associated with a previously decoded portion of the video stream. The processor may be configured to execute instructions stored in the memory to generate a modified probability distribution for decoding a current portion from the video stream using the current probability distribution, decode the current portion using the modified probability distribution, identify a forward update probability distribution for the current portion, and generate an adapted probability distribution based on the current probability distribution and the forward update probability distribution.

Another aspect is an apparatus for encoding a video stream. The apparatus may include a memory and at least one processor configured to execute instructions stored in the memory to identify a current portion of an input video stream and identify a current probability distribution, which may be an adapted probability distribution associated with a previously encoded portion of the video stream. The processor may be configured to execute instructions stored in the memory to identify a forward update probability distribution based on the current portion, generate a modified probability distribution for the current portion based on the forward update probability distribution and the current probability distribution, generate an encoded portion based on the current portion and the modified probability distribution, and generate an adapted probability distribution based on the current probability distribution and the forward update probability distribution.

Variations in these and other aspects will be described in additional detail hereafter.

BRIEF DESCRIPTION OF THE DRAWINGS

The description herein makes reference to the accompanying drawings wherein like reference numerals refer to like parts throughout the several views, and wherein.

DETAILED DESCRIPTION

Digital video may be used for various purposes including, for example, remote business meetings via video conferencing, high definition video entertainment, video advertisements, and sharing of user-generated videos. The generation and display of a video signal, such as high quality digital video communicated using a limited bandwidth medium, can include video compression using one or more video compression schemes. Video compression schemes can include encoding and decoding schemes using entropy coding to improve compression without loss of data.

Entropy coding may include representing symbols from an input data stream, such as a video stream, as codes in an encoded output data stream. The codes may be associated with the symbols based on estimated probabilities that the symbols will appear in the input data stream. The probabilities may be estimated so that the shortest codes may be associated with the most frequent symbols; however, the symbol frequency in some input data, such as video or other multimedia data, may be non-stationary and may vary significantly over time, which may reduce the accuracy of the probabilities.

To maintain entropy coding accuracy, the probabilities may be continuously adapted. For example, symbol counts may be updated and probabilities may be calculated for each symbol processed. However, calculating probabilities for each symbol processed may over-utilize resources, such as processing resources, and may be subject to error caused by noise in the input data stream. To maintain accurate probabilities and reduce noise error using fewer resources adaptive stochastic entropy coding may be used.

Implementations of adaptive stochastic entropy coding may include using backward adaptation, forward adaptation, or a combination of backwards and forwards adaptation. Implementations of backwards adaptation may include periodically updating the probabilities based on symbol counts for a portion of the input data stream associated with the period, such as a frame, a row, a group of rows, a segment, a block, or a group of blocks. The symbol probability distribution may vary during the portion of the input data stream and forward adaptation may be used to maintain accuracy for encoding the portion. Implementations of forward adaptation may include encoding the portion of the input data stream using a modified probability and indicating the modified probability in the encoded output data.

Figure 1:
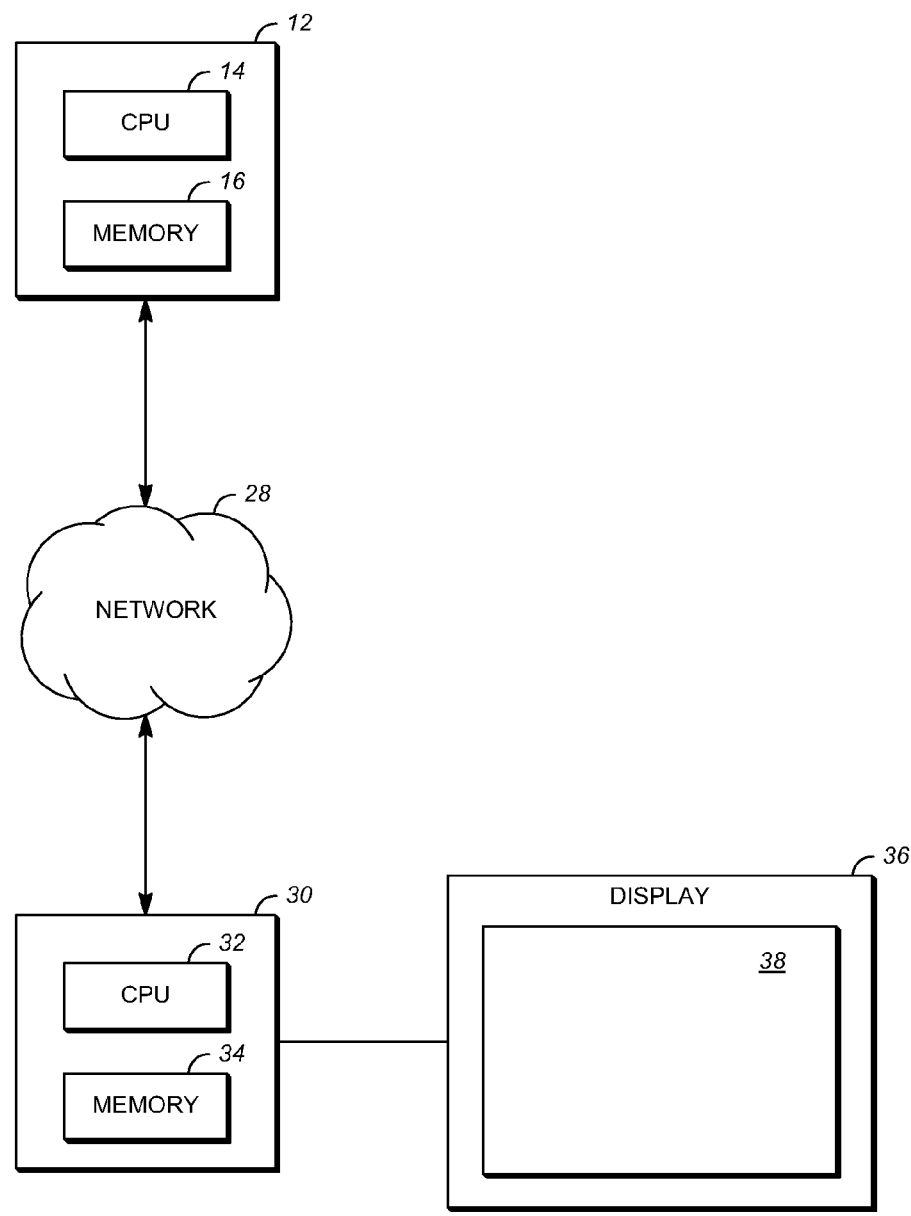
FIG. 1 is a diagram of a video encoding and decoding system in accordance with implementations of this disclosure.

FIG. 1 is a diagram of a video encoding and decoding system 10 in accordance with implementations of this disclosure. A transmitting station 12 can be, for example, a computing device having an internal configuration of hardware including a processor such as a central processing unit (CPU) 14 and a memory 16. The CPU 14 can be a controller for controlling the operations of the transmitting station 12. The CPU 14 can be connected to the memory 16 by, for example, a memory bus. The memory 16 can be read only memory (ROM), random access memory (RAM), or any other suitable memory device. The memory 16 can store data and program instructions which can be used by the CPU 14. Other suitable implementations of the transmitting station 12 are possible. As used herein, the term "computing device" includes a server, a hand-held device, a laptop computer, a desktop computer, a special purpose computer, a general purpose computer, or any device, or combination of devices, capable of performing any method, or any portion thereof, disclosed herein.

A network 28 can connect the transmitting station 12 and a receiving station 30 for encoding and decoding of the video stream. Specifically, the video stream can be encoded in the transmitting station 12 and the encoded video stream can be decoded in the receiving station 30. The network 28 can, for example, be the Internet. The network 28 can also be a local area network (LAN), wide area network (WAN), virtual private network (VPN), a mobile or cellular telephone network, or any other means of transferring the video stream from the transmitting station 12 to, in this example, receiving station 30.

The receiving station 30, in one example, can be a computing device having an internal configuration of hardware including a processor such as a central processing unit (CPU) 32 and a memory 34. The CPU 32 may be a controller for controlling the operations of the receiving station 30. The CPU 32 can be connected to the memory 34 by, for example, a memory bus. The memory 34 can be ROM, RAM or any other suitable memory device. The memory 34 can store data and program instructions can be used by the CPU 32. Other suitable implementations of receiving station 30 are possible. For example, the processing of the receiving station 30 can be distributed among multiple devices.

A display 36 configured to display a video stream can be connected to the receiving station 30. The display 36 can be implemented in various ways, including by a liquid crystal display (LCD), a cathode-ray tube (CRT), or a light emitting diode display (LED), such as an OLED display. The display 36 can be coupled to CPU 32 and can be configured to display a rendering 38 of the video stream decoded by a decoder in receiving station 30.

Other implementations of the video encoding and decoding system 10 are possible. For example, an implementation can omit the network 28, the display 36, or both. In an implementation, a video stream can be encoded and stored for transmission at a later time by the receiving station 30 or any other device having memory. In an implementation, the receiving station 30 can receive (e.g., via network 28, a computer bus, and/or some communication pathway) the encoded video stream and can store the video stream for later decoding. In another implementation, additional components can be added to the video encoding and decoding system 10. For example, a display or a video camera can be attached to the transmitting station 12 to capture the video stream to be encoded. In an implementation, a real-time transport protocol (RTP) is used for transmission. In another implementation, a transport protocol other than RTP may be used, e.g. a Hyper Text Transport Protocol (HTTP)-based video streaming protocol.

Figure 2:
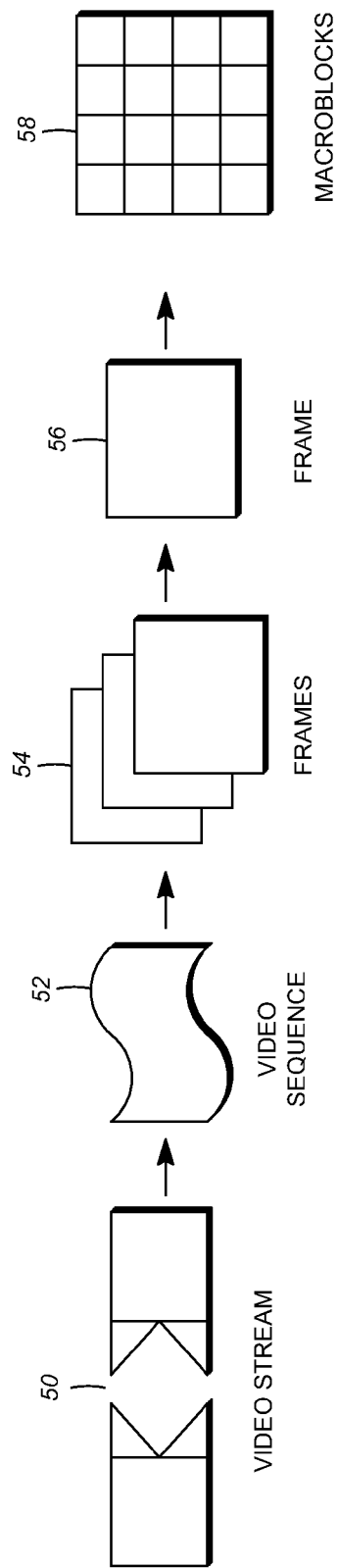
FIG. 2 is a diagram of a typical video stream for encoding and decoding in accordance with implementations of this disclosure.

FIG. 2 is a diagram of a video stream 50 for encoding and decoding in accordance with implementations of this disclosure. video stream 50 includes a video sequence 52. At the next level, the video sequence 52 includes a number of adjacent frames 54. While three frames are depicted in adjacent frames 54, the video sequence 52 can include any number of adjacent frames. The adjacent frames 54 can then be further subdivided into a single frame 56. At the next level, the single frame 56 can be divided into a series of blocks 58. Although not shown in FIG. 2, a block 58 can include pixels. For example, a block can include a 16×16 group of pixels, an 8×8 group of pixels, an 8×16 group of pixels, or any other group of pixels. Unless otherwise indicated herein, the term 'block' can include a macroblock, a segment, a slice, or any other portion of a frame. A frame, a block, a pixel, or a combination thereof can include display information, such as luminance information, chrominance information, or any other information that can be used to store, modify, communicate, or display the video stream or a portion thereof.

Figure 3:
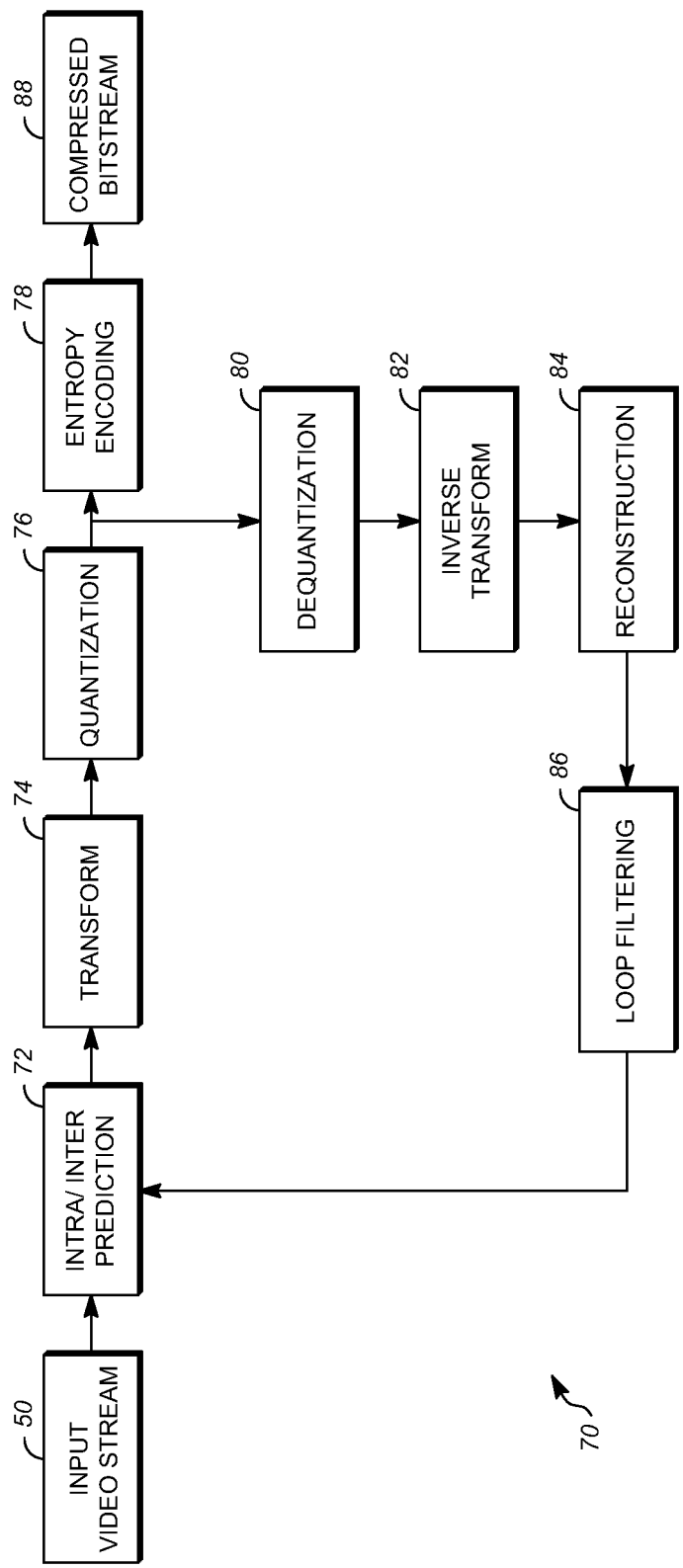
FIG. 3 is a block diagram of a video compression device in accordance with implementations of this disclosure.

FIG. 3 is a block diagram of an encoder 70 in accordance with implementations of this disclosure. Encoder 70 can be implemented, as described above, in the transmitting station 12 as a computer software program stored in memory 16, for example. The computer software program can include machine instructions that, when executed by CPU 14, cause transmitting station 12 to encode video data in the manner described in FIG. 3. Encoder 70 can be implemented as specialized hardware included, for example, in transmitting station 12. Encoder 70 can be implemented as specialized hardware included, for example, in transmitting station 12. The encoder 70 can encode an input video stream 50. The encoder 70 may have the following stages to perform the various functions in a forward path (shown by the solid connection lines) to produce an encoded or a compressed bitstream 88: an intra/inter prediction stage 72, a transform stage 74, a quantization stage 76, and an entropy encoding stage 78. The encoder 70 can include a reconstruction path (shown by the dotted connection lines) to reconstruct a frame for encoding of further blocks. The encoder 70 may have the following stages to perform the various functions in the reconstruction path: a dequantization stage 80, an inverse transform stage 82, a reconstruction stage 84, and a loop filtering stage 86. Other structural variations of the encoder 70 can be used to encode the video stream 50.

When the video stream 50 is presented for encoding, each frame 56 within the video stream 50 can be processed in units of blocks. At the intra/inter prediction stage 72, each block can be encoded using either intra-frame prediction, which may be within a single frame, or inter-frame prediction, which may be from frame to frame. In either case, a prediction block can be formed. In the case of intra-prediction, a prediction block can be formed from samples in the current frame that have been previously encoded and reconstructed. In the case of inter-prediction, a prediction block can be formed from samples in one or more previously constructed reference frames.

Next, still referring to FIG. 3, the prediction block can be subtracted from the current block at the intra/inter prediction stage 72 to produce a residual block. The transform stage 74 transforms the residual block into transform coefficients in, for example, the frequency domain. Examples of block-based transforms include the Karhunen-Loève Transform (KLT), the Discrete Cosine Transform (DCT), and the Singular Value Decomposition Transform (SVD). In one example, the DCT transforms the block into the frequency domain. In the case of DCT, the transform coefficient values may be based on spatial frequency, with the lowest frequency (i.e. DC) coefficient at the top-left of the matrix and the highest frequency coefficient at the bottom-right of the matrix.

The quantization stage 76 can convert the transform coefficients into discrete quantum values, which may be referred to as quantized transform coefficients or quantization levels. The quantized transform coefficients can be entropy encoded by the entropy encoding stage 78. Entropy encoding can include using a probability distribution metric. The entropy-encoded coefficients, together with the information used to decode the block, which may include the type of prediction used, motion vectors, and quantizer value, can be output to the compressed bitstream 88. The compressed bitstream 88 can be formatted using various techniques, such as run-length encoding (RLE) and zero-run coding.

The reconstruction path in FIG. 3 (shown by the dotted connection lines) can be used to help provide that both the encoder 70 and a decoder 100 (described below) with the same reference frames to decode the compressed bitstream 88. The reconstruction path can perform functions that are similar to functions that take place during the decoding process that are discussed in more detail below, including dequantizing the quantized transform coefficients at the dequantization stage 80 and inverse transforming the dequantized transform coefficients at the inverse transform stage 82 to produce a derivative residual block. At the reconstruction stage 84, the prediction block that was predicted at the intra/inter prediction stage 72 can be added to the derivative residual block to create a reconstructed block. The loop filtering stage 86 can be applied to the reconstructed block to reduce distortion such as blocking artifacts.

Other variations of the encoder 70 can be used to encode the compressed bitstream 88. For example, a non-transform based encoder 70 can quantize the residual block directly without the transform stage 74. In another implementation, an encoder 70 can have the quantization stage 76 and the dequantization stage 80 combined into a single stage.

Figure 4:
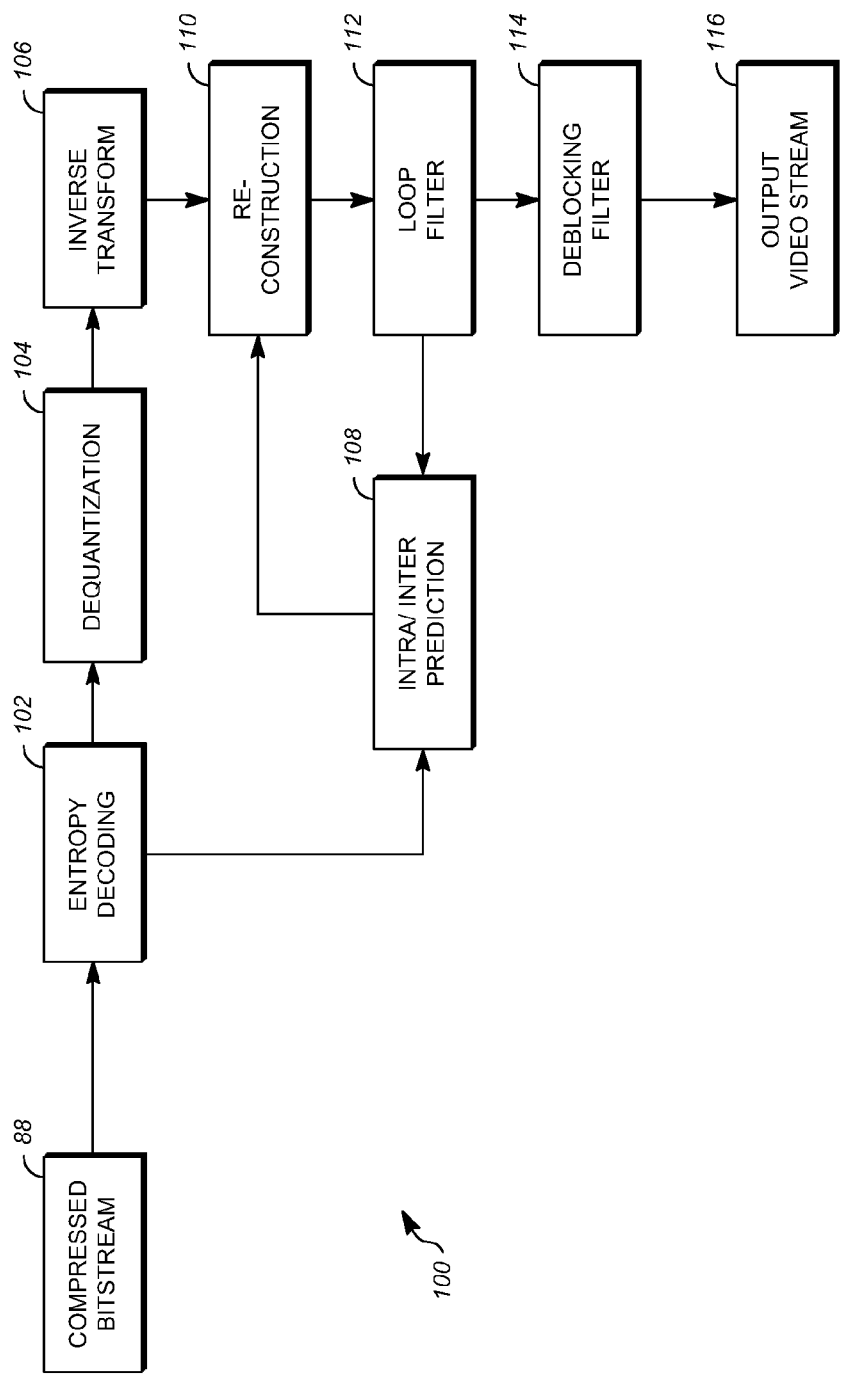
FIG. 4 is a block diagram of a video decompression device in accordance with implementations of this disclosure.

FIG. 4 is a block diagram of a decoder 100 in accordance with implementations of this disclosure. The decoder 100 can be implemented in a device, such as the receiving station 30 described above, for example, using a computer software program stored in memory 34. The computer software program can include machine instructions that, when executed by CPU 32, cause receiving station 30 to decode video data in the manner described in FIG. 4. Decoder 100 can also be implemented as specialized hardware included, for example, in transmitting station 12 or receiving station 30.

The decoder 100, may be similar to the reconstruction path of the encoder 70 discussed above, and can include, in one example, the following stages to perform various functions to produce an output video stream 116 from the compressed bitstream 88: an entropy decoding stage 102, a dequantization stage 104, an inverse transform stage 106, an intra/inter prediction stage 108, a reconstruction stage 110, a loop filtering stage 112 and a deblocking filtering stage 114. Other structural variations of the decoder 100 can be used to decode the compressed bitstream 88.

When the compressed bitstream 88 is presented for decoding, the data elements within the compressed bitstream 88 can be decoded by the entropy decoding stage 102 (using, for example, Context Adaptive Binary Arithmetic Decoding) to produce a set of quantized transform coefficients. The dequantization stage 104 can dequantize the quantized transform coefficients, and the inverse transform stage 106 can inverse transform the dequantized transform coefficients to produce a derivative residual block that can be identical to that created by the inverse transformation stage 84 in the encoder 70. Using header information decoded from the compressed bitstream 88, the decoder 100 can use the intra/inter prediction stage 108 to create the same prediction block as was created in the encoder 70. At the reconstruction stage 110, the prediction block can be added to the derivative residual block to create a reconstructed block. The loop filtering stage 112 can be applied to the reconstructed block to reduce blocking artifacts. The deblocking filtering stage 114 can be applied to the reconstructed block to reduce blocking distortion, and the result is output as the output video stream 116.

Other variations of the decoder 100 can be used to decode the compressed bitstream 88. For example, the decoder 100 can produce the output video stream 116 without the deblocking filtering stage 114.

Figure 5:
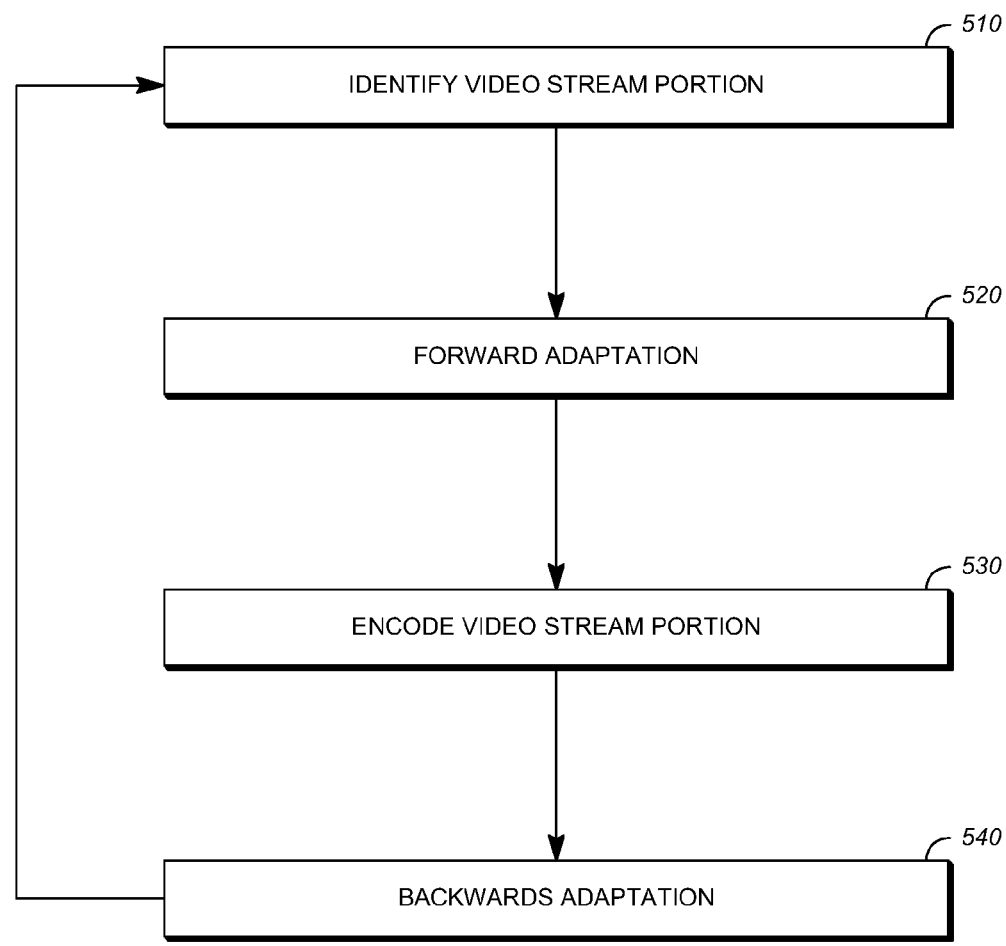
FIG. 5 is a block diagram of adaptive stochastic entropy encoding in accordance with implementations of this disclosure.

FIG. 5 is a block diagram of adaptive stochastic entropy encoding 500 in accordance with implementations of this disclosure. Implementations of adaptive stochastic entropy encoding 500 can include identifying a current portion of an input data stream at 510, performing forward adaptation at 520, encoding the portion of the input data stream at 530, performing backwards adaptation at 540, or a combination thereof. Adaptive stochastic entropy encoding 500, or any portion thereof, can be implemented in a device, such as the transmitting station 12 shown in FIG. 1. For example, an encoder, such as the encoder 70 shown in FIG. 3, can implement adaptive stochastic entropy encoding 500, or any portion thereof, using instruction stored on a tangible, non-transitory, computer readable media, such as memory 16 shown in FIG. 1.

A current portion of an input data stream, such as the input video stream 50 shown in FIGS. 2 and 3, may be identified at 510. The current portion may be any portion of the input data stream, such as a frame, a row, a group of rows, a segment, a block, or a group of blocks. The size of the current portion may correspond with an update interval. For example, the current portion may be a frame and the update interval may be per frame.

Identifying the current portion may include generating symbol counts for the current portion. For example, a symbol count may be generated for each symbol in the input data stream. For the current portion, the symbol count for each symbol may be set to zero (0), and may be incremented for each appearance of a respective symbol in the current portion.

Identifying the current portion may include identifying current probabilities for encoding the current portion. For example, the current probability for a symbol, such as the binary symbol 0, may be referred to as P. In an implementation, the current probabilities for generating an encoded portion may be identified at the encoder such that a decoder may identify equivalent probabilities for decoding the encoded portion. In an implementation, the encoder and the decoder may synchronize probabilities. For example, the current probabilities may be identified by the encoder and the decoder based on a key frame. In an implementation, the current probabilities may be based on backwards adaptation performed for a previously encoded portion of the input data stream.

Forward adaptation may be performed at 520. Implementations of forward adaptation may include identifying forward update probabilities for the current portion and generating modified probabilities for the current portion. The forward update probabilities may be identified based on the distribution of the symbols (symbol counts) in the current portion. For example, the current probabilities may include the current probability P for a symbol, such as the binary symbol 0, and the forward update probability Q for the symbol may be identified based on the distribution (count) of the symbol in the current portion. The modified probabilities may be based on the current probabilities and the forward update probabilities. For example, the modified probability Q' for a symbol, such as the binary symbol 0, may be based on the current probability P and the forward update probability Q for the symbol. Although binary symbols are described for simplicity, any symbols may be used. For example, a non-binary symbol may be converted to a binary symbol.

Implementations of forward adaptation may include generating modified probabilities based on the current probabilities and the forward update probabilities. In an implementation, the forward update probability Q may be encoded lossily and differentially as the modified probability Q' based on the current probability P. Forward adaptation may include differential encoding of the modified probability Q' for a symbol in the current block using a variable length code. In an implementation, forward adaptation may be performed in an open-loop manner.

For example, a differential d may be determined for each candidate probability q in a set of candidate probabilities based on the difference between the candidate probability q and the current probability P, which may be expressed as d=q−P. For example, the set of candidate probabilities may include probabilities in the range $P_{START}$ to $P_{STOP}$, where $P_{START}$ and $P_{STOP}$ are limits of probability values that are searched. For example, the forward update probability Q may be greater than the current probability P, and $P_{START}$ may be P and $P_{STOP}$ may be Q, such that probabilities between P and Q inclusive are searched. In some implementations, higher values of Q may be searched and $P_{STOP}$ may be a multiple of Q, which may be expressed as $P_{STOP}=Q+(Q-P)/2$.

Differential encoding may include identifying a number of bits for encoding d, identifying a savings metric based on the savings achieved when P is modified to q for each instance of a symbol in the current portion, and identifying a difference between the savings and a number of bits for encoding d. A value of q that maximizes the overall savings may be used as Q'. The corresponding d may be encoded in the bitstream, and may be decoded, for example at a decoder, to obtain Q', which may be expressed as Q'=P+d.

In an implementation, the probabilities may be in the set 1 to $P_{MAX}$. For example, 8-bit precision may be used to represent the probabilities, and $P_{MAX}$ may be $2^8-1$ or 255.

The probabilities or zero and 256 may be excluded from the encoded bit-stream. The differential d may be in the set {−P+1, −P+2, . . . , −1, 0, 1, . . . , $P_{MAX}$−d}. In some implementations, the variable length code for the differential d may be generated such that values {−aM, −(a−1)M, . . . , −2M, −M, 0, M, 2M, . . . , (b−1)M, bM} have a smaller code length than the rest of the values. M may be a small number such that every M value of probability (i.e. at a lower precision) is significantly cheaper to encode than the corresponding full precision value. This may ensure that the search process finds a value Q' that is close enough to Q to produce optimal, or nearly optimal, bit-rate savings, but which is also significantly cheaper to transmit.

In an implementation, forward adaptation may include, for P in {1, 2, . . . , $P_{MAX}$}, generate an index mapping scheme that maps Q to a value R in {0, 1, 2, . . . , $P_{MAX}$−1} by scanning the values starting from P and alternating between the positive and negative values, such that consecutive values are at differences d={0, 1, −1, 2, −2, 3, −3, . . . } from P with appropriate corrections for the bounds of P (1 and $P_{MAX}$). For example, P may be closer to the upper bound $P_{MAX}$, and the values of d={0, 1, −1, 2, −2, . . . , $P_{MAX}$−d, −($P_{MAX}$−d), −($P_{MAX}$−d)−1, (−$P_{MAX}$−d)−2, . . . , −d+1} may be mapped to values of R={0, 1, 2, 3, 4, . . . , $P_{MAX}$−1} respectively. R may be naturally organized such that smaller values correspond to smaller differences and larger values correspond to higher differences. Implementations of forward adaptation may include a second round of index mapping where R maps to S in {0, 1, . . . , $P_{MAX}$−1} such that values of R that are multiples of M, which may be a small value such as {0, M, 2M, . . . }, may be mapped to {0, 1, 2, . . . } respectively and other values that are not multiples of M may be pushed back to higher values in order. This value of S may be between 1 and $P_{MAX}$−1, and can be coded simply using, for example, a terminated exponential Golomb or sub-exponential code. The value of S=0 may correspond to R=0 and may correspond to the difference d=0, such that S=0 may indicate no update to the probability. In some implementations, the value of S may be encoded separately. For example, a single bit may be encoded using, for example, arithmetic coding, which may indicate whether there is a probability update, and if there is an update the value of 5-1 may be encoded using an exponential Golomb or sub-exponential code. Other implementations of forward adaptation may be used.

The current portion of the input data stream may be encoded using the modified probabilities at 530. For example, each symbol in the current portion may be encoded using a corresponding code from the modified probabilities identified at 520. In an implementation, a symbol, such as the binary symbol 0, may be encoded using the modified probability Q'. The encoded symbols (codes) may be included in the output data stream.

Backwards adaptation may be performed at 540. Implementations of backwards adaptation may include determining adapted probabilities based on the current probabilities and the forward update probabilities. For example, the adapted probabilities may be determined based on a weighted average of the current probabilities and the forward update probabilities. Although the forward update probabilities may be used as the adapted probabilities, using a weighted average may reduce noise error and improve stability. The weighting may be based on symbol count for the current portion. In some implementations, higher symbol counts may indicate that the generated probabilities are more accurate. For example, the symbol counts may be high and the generated probabilities may be given a high weight, or the symbol counts may be low and the generated probabilities may be given a low weight.

In an implementation, the adapted probability P' for a symbol, such as the binary symbol 0, may be determined based on the current probability P for the symbol, the forward update probability Q for the symbol, and a weight α. The weight α may be based on the count n of the symbol in the current portion, a maximum update threshold A, such as 0.5, and a count saturation threshold N, such as 16. For example, generating an adapted probability P' for a symbol based on a forward update probability Q may be expressed as the following where the weight α=n*A/N for n<=N and α=A for n>N:

$$P'=(1-\alpha)*P+\alpha*Q. \qquad \text{[Equation 1]}$$

The adapted probabilities may be used for encoding another portion of the input data stream.

Other implementations of the diagram of adaptive stochastic entropy encoding as shown in FIG. 5 are available. In implementations, additional elements of adaptive stochastic entropy encoding can be added, certain elements can be combined, or certain elements can be removed. For example, in an implementation, forward adaptation can be skipped or omitted for one or more portions and the symbols can be encoded using the current probabilities.

Figure 6:
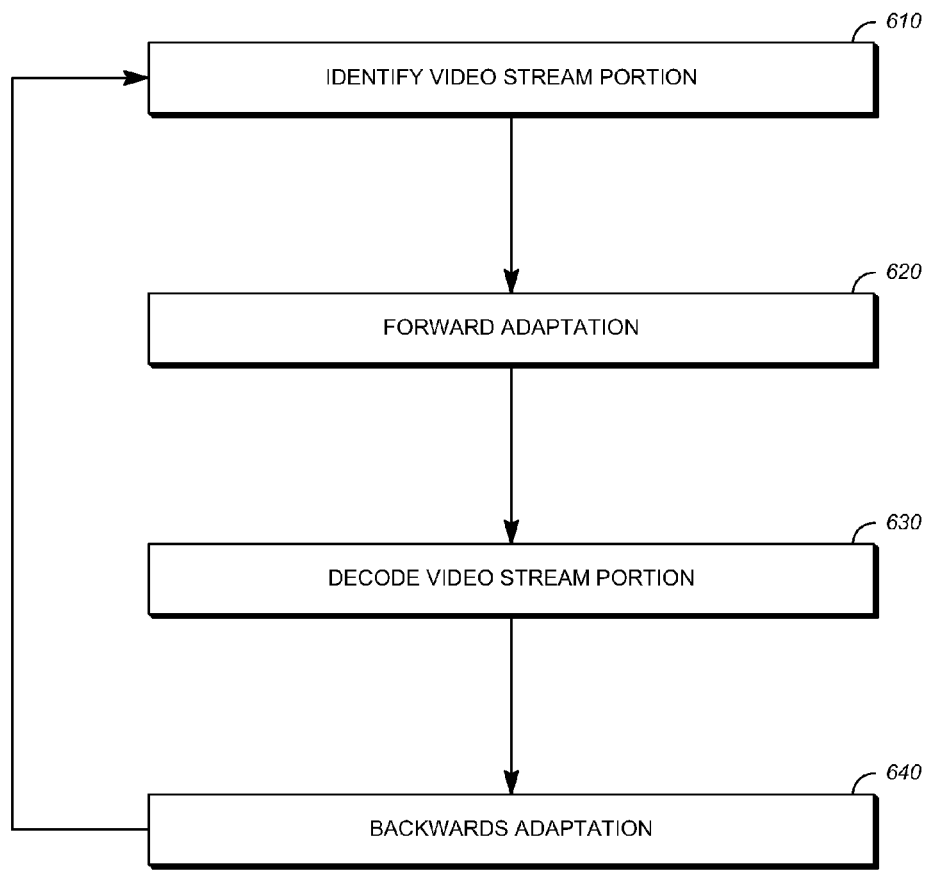
FIG. 6 is a block diagram of adaptive stochastic entropy decoding in accordance with implementations of this disclosure.

FIG. 6 is a block diagram of adaptive stochastic entropy decoding 600 in accordance with implementations of this disclosure. Implementations of adaptive stochastic entropy decoding 600 can include identifying a current portion of an encoded data stream at 610, performing forward adaptation at 620, decoding the current portion at 630, performing backwards adaptation at 640, or a combination thereof. Adaptive stochastic entropy decoding 600, or any portion thereof, can be implemented in a device, such as the receiving station 30 shown in FIG. 1. For example, a decoder, such as the decoder 100 shown in FIG. 4, can implement adaptive stochastic entropy decoding 600, or any portion thereof, using instruction stored on a tangible, non-transitory, computer readable media, such as memory 34 shown in FIG. 1.

A current portion of an encoded data stream, such as the compressed bit stream 88 shown in FIGS. 3 and 4, may be identified at 610. Identifying the current portion may include identifying current probabilities associated with the current portion. For example, the current probability p associated with a symbol, such as the binary symbol 0, may identified. In an implementation, the current probabilities may be identified at the decoder such that an encoder may identify equivalent probabilities. In an implementation, the encoder and the decoder may synchronize probabilities. For example, the current probabilities may be identified by the encoder and the decoder using a key frame. In an implementation, the current probabilities may be based on backwards adaptation performed for a previously decoded portion of the input data stream.

Forward adaptation may be performed at 620. Implementations of forward adaptation may include decoding modified probabilities from the encoded data stream for decoding the current portion. For example, the decoder may decode a modified probability Q' from the encoded video stream using the current probability P.

The current portion may be decoded at 630. In an implementation, the modified probabilities may be used to decode the current portion. For example, the current portion may include a code corresponding to a symbol, such as the binary symbol 0, and the decoder may use the modified probability Q' corresponding to the code to decode the symbol. In an implementation, decoding the current portion may include maintaining symbol counts for each symbol in the current portion.

In an implementation, decoding the current portion may include identifying forward update probabilities. The forward update probabilities may be identified based on the distribution of the symbols (symbol counts) in the current portion. For example, the current probabilities may include the current probability P for a symbol, such as the binary symbol 0, and the forward update probability Q for the symbol may be identified based on the distribution (count) of the symbol in the current portion.

Backwards adaptation may be performed at 640. Implementations of backwards adaptation may include determining adapted probabilities based on the current probabilities and the forward update probabilities. For example, the adapted probabilities may be determined based on a weighted average of the current probabilities and the forward update probabilities. Although the forward update probabilities may be used as the adapted probabilities, using a weighted average may reduce noise error and improve stability. The weighting may be based on symbol count for the current portion. In some implementations, higher symbol counts may indicate that the generated probabilities are more accurate. For example, the symbol counts may be high and the generated probabilities may be given a high weight, or the symbol counts may be low and the generated probabilities may be given a low weight.

In an implementation, the adapted probability P' for a symbol, such as the binary symbol 0, may be determined based on the current probability P for the symbol, the forward update probability Q for the symbol, and a weight α. The weight α may be based on the count n of the symbol in the current portion, a maximum update threshold A, such as 0.5, and a count saturation threshold N, such as 16. For example, generating an adapted probability P' for a symbol based on a forward update probability Q may be expressed as the following where the weight α=n*A/N for n<=N and α=A for n>N:

$$P'=(1-\alpha)*P+\alpha*Q. \qquad \text{[Equation 2]}$$

The adapted probabilities may be used for decoding another portion of the input data stream.

Other implementations of the diagram of adaptive stochastic entropy decoding as shown in FIG. 6 are available. In implementations, additional elements of adaptive stochastic entropy decoding can be added, certain elements can be combined, or certain elements can be removed. For example, in an implementation, forward adaptation can be skipped or omitted for one or more portions and the symbols can be decoded using the current probabilities.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. As used herein, the terms "determine" and "identify", or any variations thereof, includes selecting, ascertaining, computing, looking up, receiving, determining, establishing, obtaining, or otherwise identifying or determining in any manner whatsoever using one or more of the devices shown in FIG. 1.

Further, for simplicity of explanation, although the figures and descriptions herein may include sequences or series of steps or stages, elements of the methods disclosed herein can occur in various orders and/or concurrently. Additionally, elements of the methods disclosed herein may occur with other elements not explicitly presented and described herein. Furthermore, not all elements of the methods described herein may be required to implement a method in accordance with the disclosed subject matter.

The implementations of encoding and decoding described herein illustrate some exemplary encoding and decoding techniques. However, it is to be understood that encoding and decoding, as those terms are used herein may include compression, decompression, transformation, or any other processing or change of data.

The implementations of the transmitting station 12 and/or the receiving station 30 (and the algorithms, methods, instructions, etc. stored thereon and/or executed thereby) can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors or any other suitable circuit. In the claims, the term "processor" should be understood as encompassing any of the foregoing hardware, either singly or in combination. The terms "signal" and "data" are used interchangeably. Further, portions of the transmitting station 12 and the receiving station 30 do not necessarily have to be implemented in the same manner.

Further, in one implementation, for example, the transmitting station 12 or the receiving station 30 can be implemented using a general purpose computer or general purpose/processor with a computer program that, when executed, carries out any of the respective methods, algorithms and/or instructions described herein. In addition or alternatively, for example, a special purpose computer/processor can be utilized which can contain specialized hardware for carrying out any of the methods, algorithms, or instructions described herein.

The transmitting station 12 and receiving station 30 can, for example, be implemented on computers in a real-time video system. Alternatively, the transmitting station 12 can be implemented on a server and the receiving station 30 can be implemented on a device separate from the server, such as a hand-held communications device. In this instance, the transmitting station 12 can encode content using an encoder 70 into an encoded video signal and transmit the encoded video signal to the communications device. In turn, the communications device can then decode the encoded video signal using a decoder 100. Alternatively, the communications device can decode content stored locally on the communications device, for example, content that was not transmitted by the transmitting station 12. Other suitable transmitting station 12 and receiving station 30 implementation schemes are available. For example, the receiving station 30 can be a generally stationary personal computer rather than a portable communications device and/or a device including an encoder 70 may also include a decoder 100.

Further, all or a portion of implementations can take the form of a computer program product accessible from, for example, a tangible computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described implementations have been described in order to allow easy understanding of the application are not limiting. On the contrary, the application covers various modifications and equivalent arrangements included within the scope of the appended claims, which scope is to be accorded the broadest interpretation so as to encompass all such modifications and equivalent structure as is permitted under the law.

What is claimed is:

1. A method for decoding a video stream, the method comprising:
   identifying a current probability distribution;
   decoding a modified probability distribution from an encoded video stream using the current probability distribution;
   generating a decoded current portion of a video stream by decoding the current portion from the encoded video stream using the modified probability distribution;
   identifying a forward update probability distribution for the current portion; and
   generating, by a processor in response to instructions stored on a non-transitory computer readable medium, an adapted probability distribution based on the current probability distribution and the forward update probability distribution.

2. The method of claim 1, wherein identifying the current probability distribution includes using an adapted probability distribution generated for a previously decoded portion of the encoded video stream as the current probability distribution.

3. The method of claim 1, wherein decoding the current portion includes generating symbol counts for the current portion.

4. The method of claim 1, wherein the forward update probability distribution is based on symbol counts for the current portion.

5. The method of claim 1, wherein:
   the current portion includes a plurality of symbols, wherein decoding the current portion from the encoded video stream using the modified probability distribution includes decoding each symbol from the plurality of symbols using the modified probability distribution;
   the current probability distribution includes a plurality of current probabilities such that a symbol in the plurality of symbols is associated with a current probability in the plurality of current probabilities;
   the forward update probability distribution includes a plurality of forward update probabilities such that the symbol is associated with a forward update probability in the plurality of forward update probabilities;

the adapted probability distribution includes a plurality of adapted probabilities such that the symbol is associated with an adapted probability in the plurality of adapted probabilities; and generating the adapted probability distribution includes generating the adapted probability using a weighted average of the current probability and the forward update probability.

6. The method of claim 5, wherein using the weighted average includes using a sum of a weighted current probability and a weighted forward update probability, and wherein:

the weighted current probability is a product of the current probability and a difference between one and a weight, the weighted forward update probability is a product of the forward update probability and the weight;

on a condition that a cardinality of a symbol count associated with the symbol and the current portion is greater than a count saturation threshold, the weight is a maximum update threshold; and on a condition that the cardinality is less than or equal to the count saturation threshold, the weight is a product of the cardinality and a quotient of the maximum update threshold and the count saturation threshold.

7. A method for encoding a video stream, the method comprising:

identifying a current portion of an input video stream;
identifying a current probability distribution;
identifying a forward update probability distribution based on symbol counts for the current portion;
generating a modified probability distribution for the current portion based on the forward update probability distribution and the current probability distribution;
generating an encoded portion by encoding the current portion using the modified probability distribution;
generating, by a processor in response to instructions stored on a non-transitory computer readable medium, an adapted probability distribution based on the current probability distribution and the forward update probability distribution;
including the encoded portion in the output bitstream; and
storing or transmitting the output bitstream.

8. The method of claim 7, wherein identifying the current probability distribution includes using an adapted probability distribution generated based on a previously encoded portion of the video stream as the current probability distribution.

9. The method of claim 7, wherein identifying the current portion includes generating symbol counts for the current portion.

10. The method of claim 7, wherein:
the current portion includes a plurality of symbols, wherein encoding the current portion using the modified probability distribution includes encoding each symbol from the plurality of symbols using the modified probability distribution;
the current probability distribution includes a plurality of current probabilities such that a symbol in the plurality of symbols is associated with a current probability in the plurality of current probabilities;
the forward update probability distribution includes a plurality of forward update probabilities such that the symbol is associated with a forward update probability in the plurality of forward update probabilities; and
generating the modified probability distribution includes identifying a modified probability associated with the symbol by identifying an optimal modified probability that is near the forward update probability based on the current probability.

11. The method of claim 7, wherein including the encoded portion in the output bitstream includes encoding the modified probability distribution.

12. The method of claim 7, wherein:
the current portion includes a plurality of symbols;
the current probability distribution includes a plurality of current probabilities such that a symbol in the plurality of symbols is associated with a current probability in the plurality of current probabilities;
the forward update probability distribution includes a plurality of forward update probabilities such that the symbol is associated with a forward update probability in the plurality of forward update probabilities;
the adapted probability distribution includes a plurality of adapted probabilities such that the symbol is associated with an adapted probability in the plurality of adapted probabilities; and
generating the adapted probability distribution includes generating the adapted probability using a weighted average of the current probability and the forward update probability.

13. The method of claim 12, wherein using the weighted average includes using a sum of a weighted current probability and a weighted forward update probability as the weighted average, and wherein:

the weighted current probability is a product of the current probability and a difference between one and a weight, the weighted forward update probability is a product of the forward update probability and the weight;

on a condition that a cardinality of a symbol count associated with the symbol and the current portion is greater than a count saturation threshold, the weight is a maximum update threshold; and on a condition that the cardinality is less than or equal to the count saturation threshold, the weight is a product of the cardinality and a quotient of the maximum update threshold and the count saturation threshold.

14. The method of claim 11, wherein encoding the modified probability distribution includes encoding the modified probability distribution on a condition that a cost for encoding the forward update probability exceeds a cost for encoding the modified probability distribution.

15. The method of claim 10, wherein identifying the optimal modified probability that is near the forward update probability based on the current probability includes:

determining a plurality of differentials, wherein each differential from the plurality of differentials is a difference between a respective candidate probability from a plurality of candidate probabilities and the current probability.

16. The method of claim 15, wherein the plurality of candidate probabilities includes candidate probabilities in a defined range having a defined lower limit and a defined upper limit.

17. The method of claim 16, wherein, on a condition that the forward update probability is greater than the current probability, the defined lower limit is the current probability and the defined upper limit is the forward update probability.

18. The method of claim 16, wherein the defined upper limit is a quotient of a sum of the forward update probability and a difference between the forward update probability and the current probability.

19. The method of claim 15, wherein identifying the optimal modified probability that is near the forward update probability based on the current probability includes:

for each candidate probability from the plurality of candidate probabilities:

identifying a first savings metric as a difference between a cost for encoding the symbol for the current portion using the candidate probability and a cost for encoding the symbol for the current portion using the current probability, and identifying a second savings metric as a difference between the first savings metric and a cost for encoding a differential from the plurality of differentials, the differential corresponding to the candidate probability; and identifying a candidate probability from the plurality of candidate probabilities as the optimal modified probability, the candidate probability having a maximal second savings metric.

20. The method of claim 19, wherein including the encoded portion in the output bitstream includes encoding the modified probability distribution and wherein encoding the modified probability distribution includes:

generating an encoded differential by encoding the differential corresponding to the optimal modified probability; and including the encoded differential in the output bitstream.

21. The method of claim 1, further comprising:

decoding a second modified probability distribution from the encoded video stream using the adapted probability distribution to decode the second modified probability distribution;

decoding a second current portion from the encoded video steam using the second modified probability distribution to decode the second current portion;

identifying a second forward update probability distribution based on the second current portion; and generating a second adapted probability distribution based on the second modified probability distribution and the second forward update probability distribution.

22. The method of claim 5, wherein:

the current portion includes a plurality of symbols;

the current probability distribution includes a plurality of current probabilities such that a symbol in the plurality of symbols is associated with a current probability in the plurality of current probabilities;

the modified probability distribution includes a plurality of modified probabilities such that a symbol in the plurality of symbols is associated with a modified probability in the plurality of modified probabilities, and wherein decoding the modified probability distribution using the current probability distribution includes:

decoding a differential from the encoded video stream, and determining the modified probability as a sum of the differential and the current probability.

* * * * *